United States Patent
Guo et al.

(10) Patent No.: US 9,997,493 B2
(45) Date of Patent: Jun. 12, 2018

(54) FLEXIBLE-SUBSTRATE-BASED THREE-DIMENSIONAL PACKAGING STRUCTURE AND METHOD

(71) Applicants: Institute of Microelectronics, Chinese Academy of Sciences, Beijing (CN); NATIONAL CENTER FOR ADVANCED PACKAGING (NCAP CHINA), Jiangsu (CN)

(72) Inventors: Xueping Guo, Beijing (CN); Yuan Lu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days. days.

(21) Appl. No.: 15/036,090

(22) PCT Filed: Jun. 12, 2014

(86) PCT No.: PCT/CN2014/079777
§ 371 (c)(1),
(2) Date: May 12, 2016

(87) PCT Pub. No.: WO2015/070599
PCT Pub. Date: May 21, 2015

(65) Prior Publication Data
US 2016/0293573 A1      Oct. 6, 2016

(30) Foreign Application Priority Data
Nov. 12, 2013    (CN) .......................... 2013 1 0560310

(51) Int. Cl.
*H01L 21/00*     (2006.01)
*H01L 25/065*    (2006.01)
(Continued)

(52) U.S. Cl.
CPC ........ *H01L 25/0652* (2013.01); *H01L 21/563* (2013.01); *H01L 23/3114* (2013.01);
(Continued)

(58) Field of Classification Search
CPC ............... H01L 25/0652; H01L 21/563; H01L 23/49816; H01L 23/5387
See application file for complete search history.

(56) References Cited

U.S. PATENT DOCUMENTS 7,033,911 B2 * 4/2006 Manepalli ........... H01L 23/5387
  257/E23.177
7,460,085 B2 * 12/2008 Ishii ..................... G06F 3/1423
  345/1.1
(Continued)

FOREIGN PATENT DOCUMENTS

CN       1744795 A         3/2006
CN     102254898 A        11/2011
(Continued)

OTHER PUBLICATIONS

International Search Report dated Sep. 24, 2014 in International Application PCT/CN2014/079777.

*Primary Examiner* — Laura Menz
(74) *Attorney, Agent, or Firm* — Pillsbury Winthrop Shaw Pittman LLP

(57) ABSTRACT

The present invention mainly relates to a 3-D packaging structure based on a flexible substrate and a method for manufacturing the same; the method comprises: providing a bendable continuous flexible substrate, determining the shape of the substrate according to the size, the quantity and the shape of dies, and making surface wiring on the substrate to allow interlayer electrical connection; welding dies that are to be packaged onto the bendable continuous flexible substrate; filling the gaps between the dies and the substrate with an underfill; bending the substrates towards the center
(Continued)

to allow the peripheral dies to coincide in parallel with the die situated at the center, and bonding the two layers of parallel dies with a bonding adhesive. As compared with the inventions available in the prior art, the present invention makes use of a flexible substrate as a packaging substrate, which can better satisfy the demand for high density and high levels of integration in packaging to achieve miniaturization of packaging, and realizes die packaging of good compatibility and better performance.

6 Claims, 5 Drawing Sheets

(51) Int. Cl.
| | | |
|---|---|---|
| H01L 23/538 | (2006.01) | |
| H01L 25/00 | (2006.01) | |
| H01L 23/31 | (2006.01) | |
| H01L 23/498 | (2006.01) | |
| H01L 21/56 | (2006.01) | |
| H01L 23/13 | (2006.01) | |
| H01L 23/00 | (2006.01) | |

(52) U.S. Cl.
CPC .. *H01L 23/49816* (2013.01); *H01L 23/49827* (2013.01); *H01L 23/5387* (2013.01); *H01L 25/50* (2013.01); *H01L 23/13* (2013.01); *H01L 23/3128* (2013.01); *H01L 24/16* (2013.01); *H01L 24/32* (2013.01); *H01L 24/73* (2013.01); *H01L 24/92* (2013.01); *H01L 2224/16227* (2013.01); *H01L 2224/32145* (2013.01); *H01L 2224/32225* (2013.01); *H01L 2224/73204* (2013.01); *H01L 2224/73253* (2013.01); *H01L 2224/92125* (2013.01); *H01L 2224/92225* (2013.01); *H01L 2225/06517* (2013.01); *H01L 2225/06541* (2013.01); *H01L 2225/06558* (2013.01); *H01L 2924/15311* (2013.01)

(56) References Cited

U.S. PATENT DOCUMENTS

| | | | | |
|---|---|---|---|---|
| 7,777,856 | B2* | 8/2010 | Silverbrook | B41J 2/14427 |
| | | | | 349/149 |
| 7,902,676 | B2* | 3/2011 | Chia | H01L 23/5387 |
| | | | | 257/686 |
| 8,237,165 | B2* | 8/2012 | Kim | H01L 27/3244 |
| | | | | 257/59 |
| 8,461,756 | B2* | 6/2013 | Sakai | G02B 6/0023 |
| | | | | 313/501 |
| 2006/0043562 | A1 | 3/2006 | Watanabe | |
| 2006/0203515 | A1* | 9/2006 | Fujikawa | G02B 6/0088 |
| | | | | 362/615 |
| 2007/0159070 | A1* | 7/2007 | Hu | H01L 25/048 |
| | | | | 313/504 |
| 2010/0277855 | A1* | 11/2010 | Lim | H01J 29/16 |
| | | | | 361/679.01 |
| 2012/0204453 | A1* | 8/2012 | Jung | G09F 9/301 |
| | | | | 40/517 |
| 2014/0043734 | A1* | 2/2014 | Kim | H01L 51/0097 |
| | | | | 361/679.01 |
| 2014/0049449 | A1* | 2/2014 | Park | G09G 5/00 |
| | | | | 345/1.3 |
| 2014/0065393 | A1* | 3/2014 | Lee | H01L 21/6835 |
| | | | | 428/216 |
| 2014/0110726 | A1* | 4/2014 | Naijo | H01L 51/52 |
| | | | | 257/88 |
| 2014/0117844 | A1* | 5/2014 | Naijo | H05B 33/04 |
| | | | | 313/511 |
| 2014/0145161 | A1* | 5/2014 | Naijo | H01L 51/0097 |
| | | | | 257/40 |
| 2014/0264299 | A1* | 9/2014 | Naijo | H01L 51/0017 |
| | | | | 257/40 |
| 2015/0041766 | A1* | 2/2015 | Naijo | H01L 27/3244 |
| | | | | 257/40 |
| 2016/0293573 | A1* | 10/2016 | Guo | H01L 23/5387 |

FOREIGN PATENT DOCUMENTS

| | | |
|---|---|---|
| JP | 3892259 B2 | 3/2007 |
| TW | 200917447 A | 4/2009 |

* cited by examiner

FLEXIBLE-SUBSTRATE-BASED THREE-DIMENSIONAL PACKAGING STRUCTURE AND METHOD

CROSS REFERENCE TO RELATED APPLICATION

This application is a national stage application, filed under 35 U.S.C. § 371, PCT Application No. PCT/CN2014/079777, filed on Jun. 12, 2014, entitled "FLEXIBLE-SUBSTRATE-BASED THREE-DIMENSIONAL PACKAGING STRUCTURE AND METHOD", which claimed priority to Chinese Application No. 201310560310.4, filed on Nov. 12, 2013, all of which are hereby incorporated by reference in their entirety.

FIELD OF THE INVENTION

The present invention mainly relates to a 3-D packaging structure based on a flexible substrate and a processing method for manufacturing the same.

BACKGROUND OF THE INVENTION

As the public have a greater desire for miniature, multi-functional and Green electronic products, the electronic systems for the future have to meet such growing requirements as follows: small size, light weight, high frequency and high-speed operation, low power consumption, high sensitivity, multi-function and low cost. Whilst 3-D packaging, which stands out for advantages of being capable of reducing volume and increasing utilization rate of the substrate material, is a very attractive means that satisfy these requirements.

However, most of the traditional 3-D packaging adopts a stacking technology; this structure allows to directly stack a plurality of bare dies or substrates through bonding so as to realize a metal interconnect structure in the 3-D direction, which therefore allows integration of a system or a certain function in a 3-D structure. This significantly shortens the interconnect distance and in turn improves transmission speed. However, this method is generally complex and is beset with several problems, which looms large on the production yield and product reliability. Besides, vias are usually used in this type of structure to allow connection between layers, but this requires a complex process and is rather difficult to succeed.

SUMMARY OF THE INVENTION

In respect of the aforementioned issues, the present invention is intended to provide a 3-D packaging structure based on a flexible substrate and a processing method for manufacturing the same.

A 3-D packaging structure based on a flexible substrate, which comprises:
  a bendable continuous flexible substrate;
  a plurality of dies welded on the bendable continuous flexible substrate;
  an encapsulant filling the inside of the bendable continuous substrate; and
  contacts that realize electrical connection with outer substrates.

A method for manufacturing a 3-D packaging structure based on a flexible substrate, which comprises following steps:

providing a bendable continuous flexible substrate;
  welding a plurality of dies that are to be packaged onto the bendable continuous flexible substrate;
  bending the flexible substrate to allow coincidence of the dies welded onto the continuous flexible substrate, and then adhering the coincided dies with an adhesive; and
  filling the inside of the flexible substrate with an encapsulant.

BRIEF DESCRIPTION OF THE DRAWINGS

Other additional features, aspects and advantages of the present invention are made more evident according to perusal of the following detailed description of exemplary embodiment(s) in conjunction with the appended drawings.

DETAILED DESCRIPTION OF THE INVENTION

Here below, the embodiments of the present invention are to be described at length.

Examples of the embodiments of the present invention are illustrated in the appended drawings, in which same or similar reference signs throughout denote same or similar elements or elements having same or similar functions. It should be appreciated that embodiments described below in conjunction with the drawings are illustrative, and are provided for explaining the present invention only, thus they shall not be interpreted as a limitation to the present invention. Various embodiments or examples are provided here below to implement different structures of the present invention. To simplify the disclosure of the present invention, descriptions of components and arrangements of specific examples are given below. Of course, they are illustrative only and not limiting the present invention. Moreover, in the present invention, reference numbers and/or letters may be repeated in different examples. Such repetition is for purposes of simplicity and clarity, yet does not denote any relationship between respective embodiments and/or arrangements under discussion. Furthermore, the present invention provides various examples for various processes and materials. However, it is obvious for a person of ordinary skills in the art that other processes and/or materials may be alternatively utilized.

Figure 1:
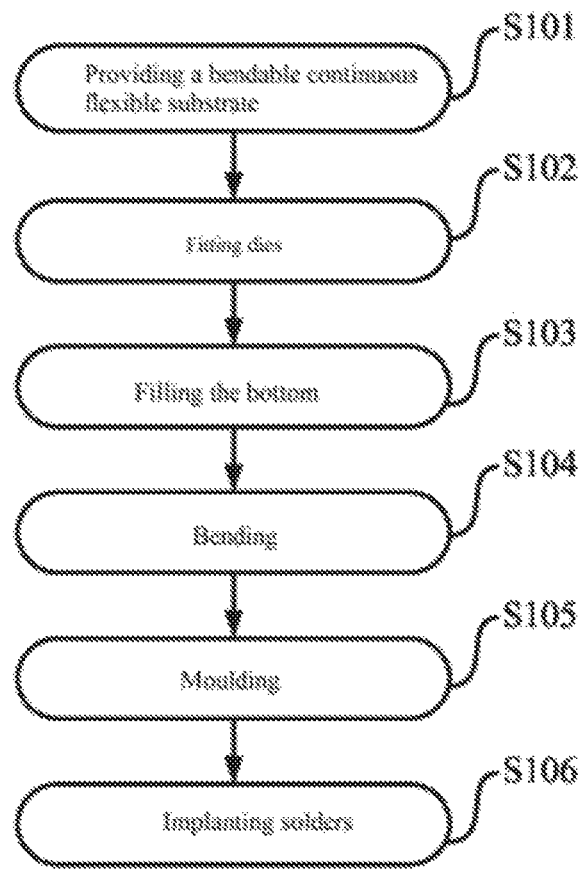
FIG. 1 illustrates a flowchart of the method for manufacturing a 3-D packaging structure provided in an embodiment of the present invention.

According to an aspect of the present invention, a method for manufacturing a 3-D packaging structure based on a flexible substrate is provided. Here below, the method for manufacturing such a structure is to be described in the embodiment 1 in conjunction with FIG. 2 to FIG. 7. As shown in FIG. 1, the method as provided by the present invention comprises following steps:

at the step S101, providing a bendable continuous flexible substrate 104, and realizing interlayer electrical connection on the bendable continuous flexible substrate 104 through making surface wiring. The shape of the substrate is determined according to such factors as the size, the shape, the quantity of dies that need to be packaged; usually, a relatively larger die is welded at the centre of the substrate so as to facilitate the process of bending, moulding and the like in the subsequent steps. In the present embodiment, since the area of the die 101 is larger than the sum of the areas of the die 102 and the die 103, packaging is done through double-layer lamination in consideration of overall stability of packaging. Therefore, when the shape of the flexible substrate 104 is taken into account, the die 101 is fitted in the middle of the flexible substrate 104, while the die 102 and the die 103 are fitted at two ends thereof; the die 101 and the die 102 are asymmetrical with each other against the die 101. Meanwhile, a length as appropriate should be reserved between the die 101, the die 102 and the die 103 according to the spatial length required at the time of folding.

At the step S102, the die 101, the die 102 and the die 103 are welded onto the bendable continuous flexible substrate 104 using BGA solders 105; the dies may be a single die or a laminated die, and also can be a pin board comprising TSV or a 3-D die integrated with TSV.

Figure 2:
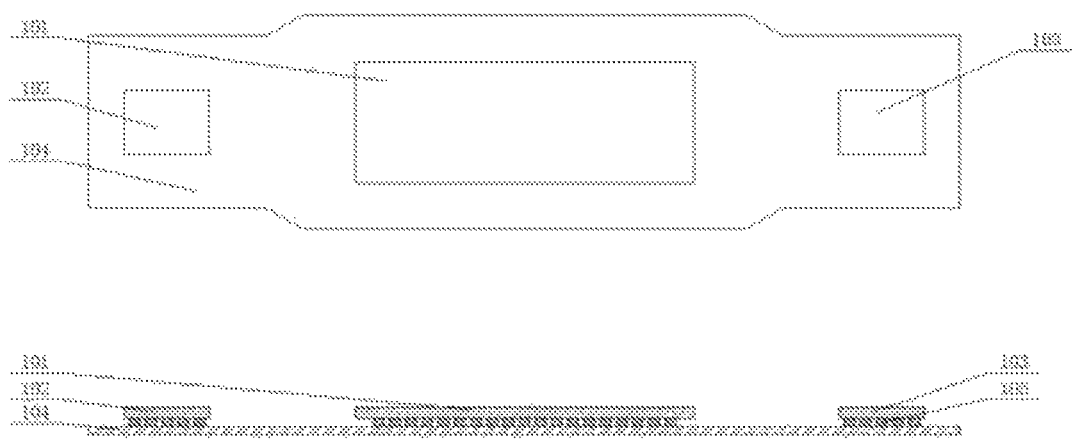
FIG. 2 illustrates a cross-sectional bird view of the continuous flexible substrate after completion of fitting dies.

Electrical connection between the dies and the substrate can be realized through packaging process in respect of the aforementioned dies. The electrical connection can be realized through a solder arrangement of flip chip, and also can be alternatively realized through a pressure welding of lead-bonding. The structure after completion of fitting is as shown in FIG. 2.

Figure 3:
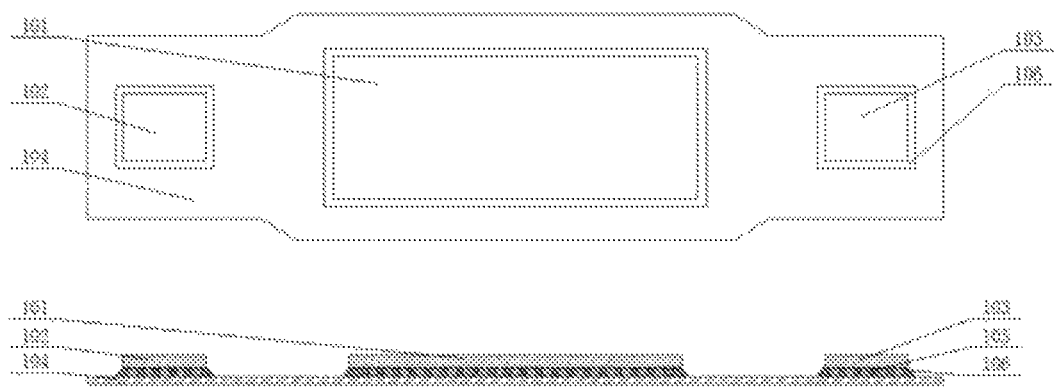
FIG. 3 illustrates a cross-sectional bird view of the continuous flexible substrate after completion of filling its bottom.

At the step S103, an underfill 106 is used to fill the gaps between each of the abovementioned dies and the bendable continuous flexible substrate and to fortify the welded dies, such that reliability of the dies are effectively strengthened. The underfill 106 is usually an one-part high-temperature cured EPDXY or any other similar adhesive. As shown in FIG. 3, at the time of applying the underfill, the underfill is applied on one side of the dies, and the underfill flows along the gaps between the dies and the substrate due to the capillary effect and gradually fills the gaps up. After the filling is completed, the underfill 106 should laterally enclose the dies entirely. The volume of the underfill is controlled, so that it is optimal that the overflowing underfill reaches two thirds of the height of the dies.

Figure 4:
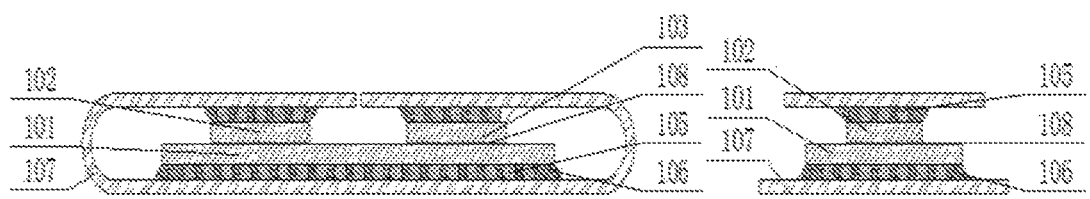
FIG. 4 illustrates a cross-sectional bird view of the continuous flexible substrate after it is bent.

At the step S104, the substrate is bent so as to make a 3-D packaging structure. Specifically, the two ends of the substrate, on which the die 102 and the die 103 are welded, are bent towards the centre thereof so that the die 102 and the die 103 fits individually with the die 101 in parallel; as shown in FIG. 4, a bonding adhesive 108 is used to adhere the parallel fitting faces of the dies so as to preliminarily form a 3-D packaging structure.

Figure 5:
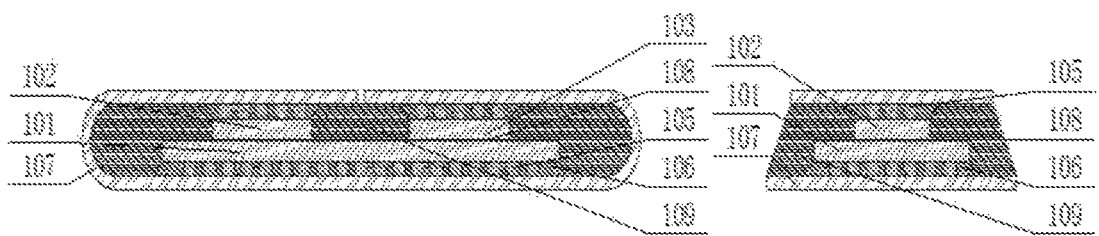
FIG. 5 illustrates a cross-sectional view of packaging after completion of moulding.

The step S105 relates to a moulding process, as shown in FIG. 5, which means the inside of the 3-D structure formed at the step S103 is filled with the encapsulant 109, so as to improve insulation between internal elements and circuits and to strengthen integrity of the packaging structure. The encapsulant 109 can be an Epoxy encapsulant, a high-conductive thermal encapsulant, an organic Si encapsulant, a PU encapsulant, a flexible resin, a thermalfusible encapsulant tar or the like.

At the time of filling the encapsulant 109, the inventors have noticed that if the flexible substrates that are stacked up and down have the same width, it would lead to overflow of the encapsulant and contaminate other joint structures. Therefore, the present invention is intended to solve this problem through gradually narrowing down the width of the flexible substrate after stacking. For example, as shown by the cross-sectional diagrams in FIG. 5, FIG. 9 and FIG. 10, the substrate at the bottom has the greatest width, while the widths of the substrates stacked thereon become progressively narrower; in this case, when the encapsulant 109 is filled, an inclined face would form on the side of the substrates under the effect of surface tension, which is analogous to the shape of a topless pyramid. This is favourable for preventing overflow of the encapsulant 109.

Specifically, in the present manufacturing method, the encapsulant fills entirely the flexible substrate of the present invention under the capillary effect in the formed structure by a means analogous to underfilling; contamination of any other structure in the flexible substrate can be avoided in the filling process, which enables better implementation of other processing steps. Besides, the packaging structure based on the flexible substrate as described above is realized through this manufacturing process.

Figure 6:
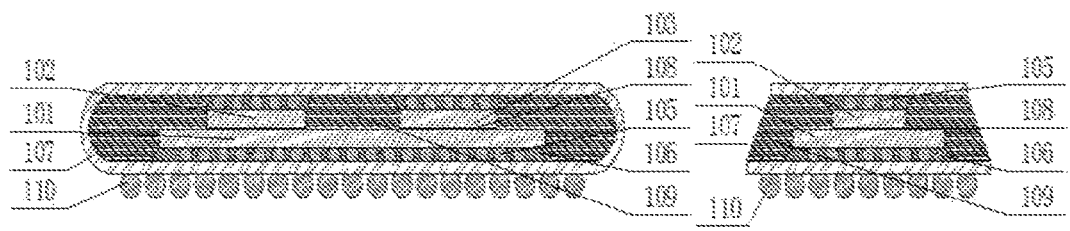
FIG. 6 illustrates a cross-sectional view of packaging after solder implantation.
Figure 7:
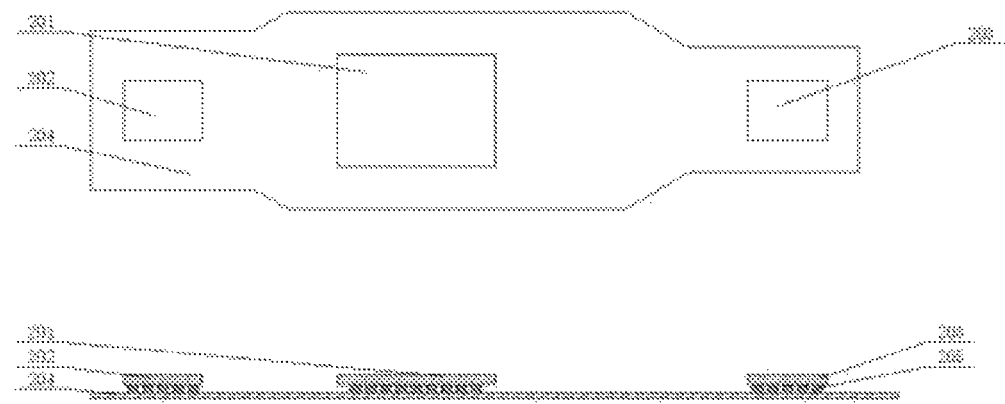
FIG. 7 to FIG. 11 illustrate respectively the diagrams at each processing step of another folding method.

Finally, implantation solders are welded onto the 3-D packaging structure after completion of filling the encapsulant 109, so as to enable electrical connection between the packaging and the outer substrates, as shown in FIG. 6. The solders can be multiple solders, including lead or lead-free welding solders, or also can be any other electrical connection form that is capable of realizing leading-out from the packaging, for example, QFN welding pad in packaging or the like.

In the present invention, the shape and the area of the bendable continuous flexible substrate can be modified accordingly on the basis of the shape, the size and the quantity of various dies. In this regard, the present invention provides embodiment 2 to illustrate this technical feature.

Figure 8:
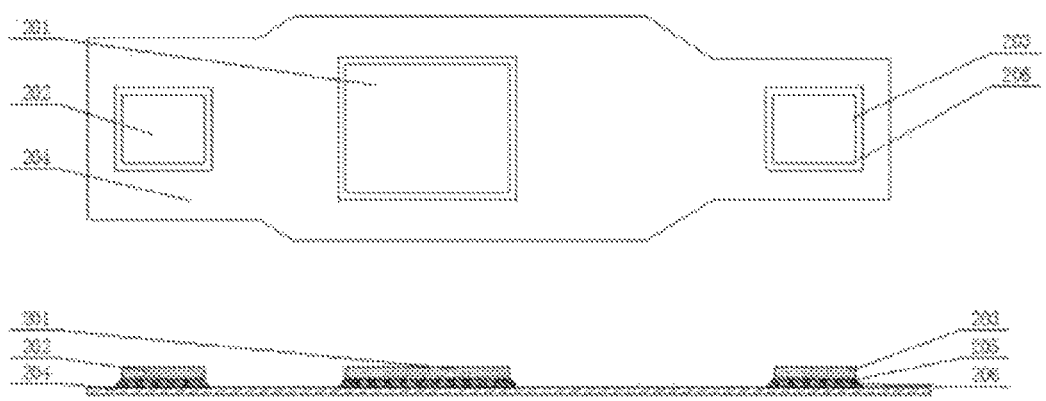

Here below, the method of manufacturing this structure is described in detail in conjunction with FIG. 7 to FIG. 11. In the embodiment 2, the specific processes are substantially identical with those of embodiment 1, as shown in FIG. 1; the difference is that the shape and the length of the substrate and the bending method can be actively modified at the time of designing the bendable continuous flexible substrate on the basis of the difference of the quantity and shape of the dies to be packaged. Specifically:

Firstly, a bendable continuous flexible substrate 204 is provided and electrical connection on the bendable continuous flexible substrate 204 is realized through surface wiring. The areas of the three dies in the present embodiment are substantially identical. When stability of the entire packaging is taken into account, a three-layer stacking is adopted at the time of bending, namely, the three dies are stacked in order. Therefore, the die 201 with a relatively larger area is fit in the middle of the flexible substrate 204, while the dies 201 and 203 are positioned at the two ends of the substrate. Because the two ends thereof are bent sequentially, the die that is bent later needs longer length in space, thus the distance from the die 203 to the die 201 is slightly greater than the distance to the die 202, as shown in FIG. 8.

Next, the dies that need to be packaged are welded on the bendable continuous flexible substrate 204 using BGA solders 205, which are specifically the die 201, the die 202 and the die 203. The dies to be packaged may be a single die or a laminated die, and may also be a pin board comprising TSV or a 3-D dies integrated with TSV.

These dies can be electrically connected with the substrate through packaging process. The electrical connection can be realized through flip-chip welding process, or can be realized through a pressure welding process of wire bonding. The structure after completion of fitting is as shown in FIG. 8.

Figure 9:
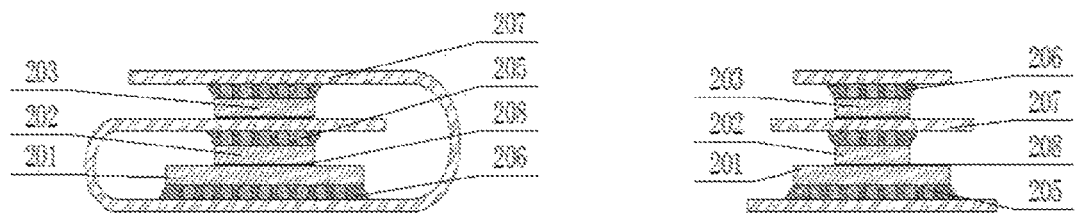

Then, the underfill 206 is used to fill the gaps between the dies and the bendable continuous flexible substrate 204 so as to fortify the dies that have been welded; this can effectively strengthen reliability of the dies. The underfill 206 is usually an one-part high-temperature cured EPDXY or any other similar adhesive. As shown in FIG. 9, at the time of applying the underfill, the underfill is applied on one side of the dies, and the underfill would flow along the gaps between the dies and the substrate under the capillary effect and gradually fills the gaps up. After the filling is completed, the underfill 106 should laterally enclose the dies entirely. Usage of the underfill is controlled, so that it is optimal that the overflowing layer of the underfill reaches two thirds of the height of the dies.

Then the substrates are bent to make a 3-D packaging structure. Specifically, on the basis of the shape of the substrate as determined above, the end, on which the die 202 has been welded, is bent towards the centre of the substrate to allow the die 202 to fit in parallel with the die 201, and the bonding adhesive 208 is used to bond the parallel fitting faces; then the other end, on which the die 203 has been welded, is bent towards the centre of the substrate, which allows the die 203 to fit in parallel with the exterior side of the end of the substrate on which the die 202 has been attached, and then the bonding adhesive 208 is used to bond the parallel fitting faces, so that a 3-D packaging structure is preliminarily formed.

Figure 10:
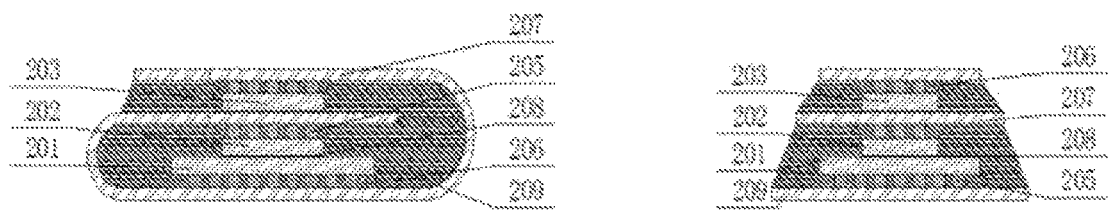

Next comes the moulding process, as shown in FIG. 10. Namely, the encapsulant 209 is used to fill the inside of the 3-D structure formed at the step S103, thereby improving insulation between the internal elements and circuits and enhancing integrity of the packaging structure. The encapsulant 209 can be an Epoxy encapsulant, a high-conductive thermal encapsulant, an organic Si encapsulant, a PU encapsulant, a flexible resin and a thermalfusible encapsulant tar or the like.

Specifically, in the present manufacturing process, the encapsulant fills entirely the flexible substrate of the present invention under the capillary effect in the formed structure by a means analogous to underfilling; contamination of any other structure in the flexible substrate can be avoided in the filling process, which enables better implementation of other processing steps. Besides, the packaging structure based on the flexible substrate as described above is realized through this manufacturing process.

Figure 11:
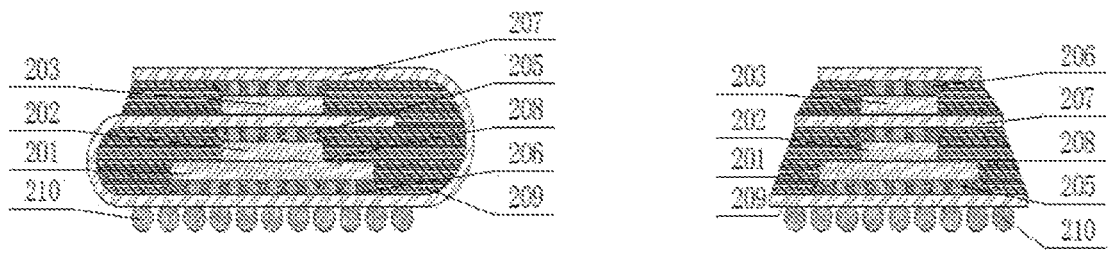

Finally, implantation solders are welded onto the 3-D packaging structure after completion of filling the encapsulant 209, so as to allow electrical connection between the packaging and the outer substrates, as shown in FIG. 11. The solders can be multiple solders, including lead or lead-free welding solders, or also can be any other electrical connection form that is capable of realizing a leading-out from the packaging, for example, QFN welding pad in a packaging or the like.

Figure 12:
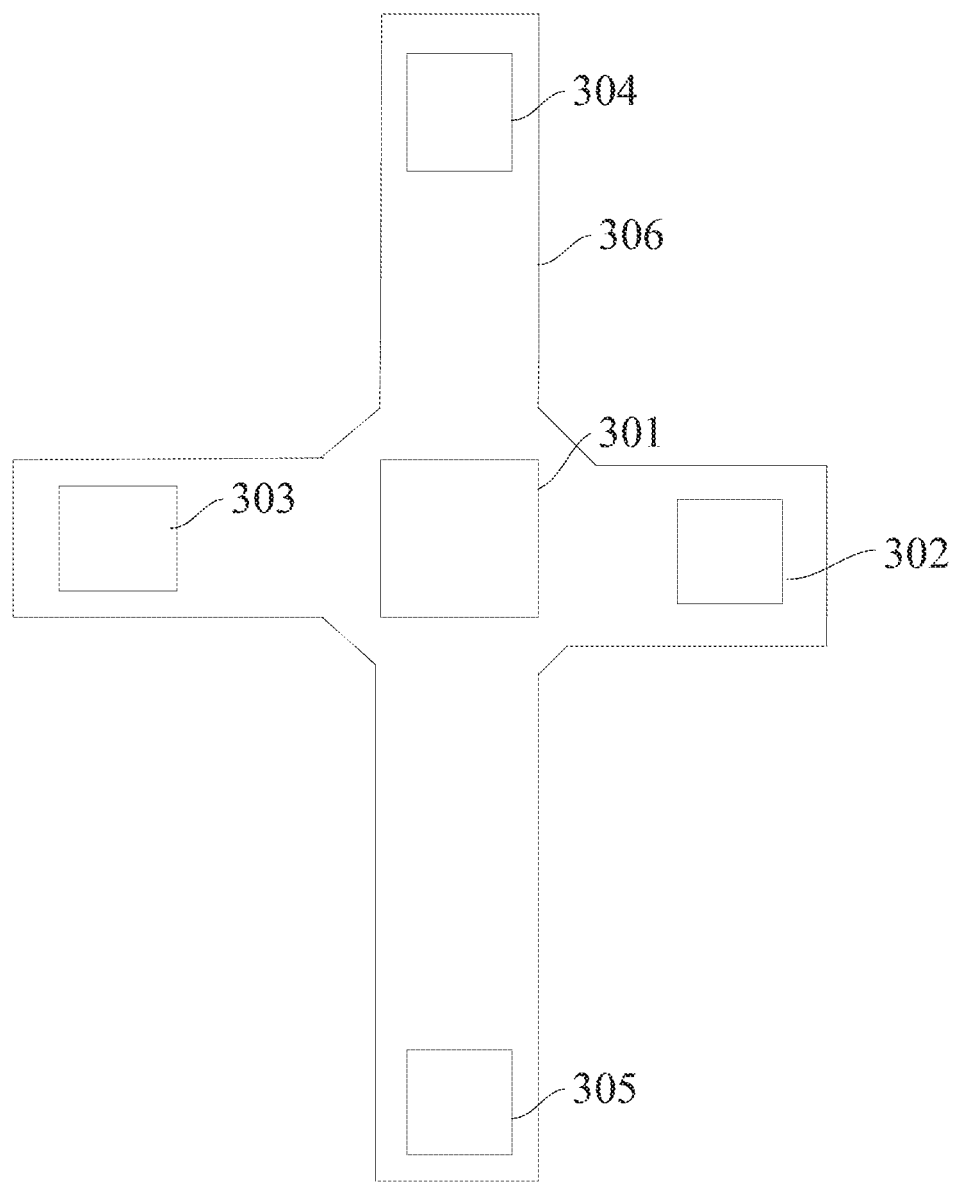
FIG. 12 illustrates a structural plan of a packaging substrate in the case of a plurality of dies.

Likewise, in respect of dies to be packaged, the shape of the bendable continuous flexible substrate can be designed according to needs in practice. For example, in respect of 3-D packaging of 5 dies based on a flexible substrate, packaging can be done through adopting the shape shown in FIG. 12.

The invention is described with examples of 3-D packaging of three or four dies, yet in fact 3-D packaging of two dies or more than four dies can be easily realized.

For example, the flexible substrate has a centre and one or more elongate extension substrate(s) extending from the centre. There are dies welded at the centre of the substrate and the ends of the elongate extension substrates. The width of the flexible substrate is relatively wider, while the widths of the ends of the each elongate extension substrate become progressively narrower according to their stacking order against the centre of the flexible substrate, such that the cross-sectional face of 3-D packaging structure after completion of stacking forms a shape of topless pyramid whose width becomes gradually narrower; this is favourable for filling the encapsulant and preventing other parts from being contaminated by overflowing encapsulant. After each elongate extension substrate is bent towards the centre, the dies on the extension substrates coincide with the die at the centre of the flexible substrate. These extension substrates are in a radial arrangement against the centre, which is thus capable of meeting the requirements for 3-D packaging multiple dies.

As compared to the prior art, the most outstanding characteristic of the present invention lies in the use of a bendable continuous flexible substrate as a packaging substrate; the flexible substrate has following advantages: narrow node gaps and fine lines can be fabricated in the flexible substrate owing to the advantages presented in manufacturing with the flexible substrate, and this can better satisfy the demand for high density and high levels of integration in packaging; the greatest superiority for which the flexible substrate outruns a rigid substrate is its flexibility, which enables bending of the substrate and thereby allowing miniaturization of its packaging. Besides, the processing method used in respect of the flexible substrate is substantially compatible with general packaging processing methods; additionally, the flexible substrate is more advantageous than the rigid substrate in terms of thermal management performance, and is thus capable of high-performance die packaging.

Although the exemplary embodiments and their advantages have been described in detail, it should be understood that various alternations, substitutions and modifications may be made to the embodiments without departing from the spirit of the present invention and the scope as defined by the appended claims. For other examples, it may be easily recognized by a person of ordinary skills in the art that the order of processing steps may be altered without departing from the scope of the present invention.

In addition, the scope to which the present invention is applied is not limited to the process, mechanism, manufacture, material composition, means, methods and steps described in the specific embodiments in the specification. According to the disclosure of the present invention, a person of ordinary skills in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A 3-D packaging structure based on a flexible substrate comprising:
   a bendable continuous flexible substrate;
   a plurality of dies welded on the bendable continuous flexible substrate, wherein electrical connection among the plurality of dies is realized by surface wiring on the bendable continuous flexible substrate;
   an encapsulant filling an inside of the 3-D packing structure, wherein a width of the 3-D packing structure decreases progressively; and
   contacts that enables electrical connection with an outer side of the bendable continuous flexible substrate.

2. The 3-D packaging structure of claim 1, wherein a shape and a length of the bendable continuous flexible substrate and a position of each of the plurality of dies on the bendable continuous flexible substrate are determined based on a shape of each die of the plurality of dies, a size of each die of the plurality of dies, and a quantity of the plurality of dies to be packaged.

3. The 3-D packaging structure of claim 1, wherein the 3-D packing structure comprises a multi-layer 3-D packaging structure realized by bending and folding the bendable continuous flexible substrate.

4. The 3-D packaging structure of claim 1, wherein each of the plurality of dies comprises at least one of a single die, stacked dies, a pin board comprising TSV, and a 3-D die integrated with TSV.

5. The 3-D packaging structure of claim 1, wherein the bendable continuous flexible substrate has a centre and one or more elongate extension substrates extending from the centre, and one or more of the plurality of dies are welded on both the centre and each end of the one or more elongate extension substrates.

6. The 3-D packaging structure of claim 5, wherein the one or more of the plurality of dies at each end of the one or more elongate extension substrates coincide with a die at the centre of the bendable continuous flexible substrate after the bendable continuous flexible substrate is bent.

* * * * *